Sept. 5, 1961 F. G. MASON ET AL 2,999,156
RADIO FREQUENCY TUNERS HAVING VARIABLE
TRACKING AND COUPLING MEANS
Filed Jan. 14, 1959 2 Sheets-Sheet 1

INVENTORS
Harold T. Lyman
Francis G. Mason
BY
Ooms, McDougall,
Williams & Hersh
Attorneys INVENTORS
Harold T. Lyman
Francis G. Mason
BY Ooms, McDougall, Williams & Hersh
Attorneys United States Patent Office 2,999,156

Patented Sept. 5, 1961

2,999,156

RADIO FREQUENCY TUNERS HAVING VARIABLE TRACKING AND COUPLING MEANS

Francis G. Mason, Weston, and Harold T. Lyman, Milford, Conn., assignors to Aladdin Industries, Incorporated, Nashville, Tenn., a corporation of Illinois Filed Jan. 14, 1959, Ser. No. 786,717

6 Claims. (Cl. 250—40)

This invention relates to radio frequency tuners and is particularly applicable to tuners adapted to cover an extremely wide frequency range.

One object of the present invention is to provide a new and improved tuner of the foregoing character which has a pair of tuned circuits or tuning devices, together with means for adjusting the coupling between the circuits to the desired value throughout the tuning range, and also means for tracking the tuned circuits to the same tuning curve throughout the frequency range.

A further object is to provide a new and improved tuner of the foregoing character having variable coupling and tracking devices which are operated by adjustable cams.

Another object is to provide such a new and improved tuner in which each of the cams has a large number of individually bendable tabs for adjusting the coupling and tracking at a large number of points throughout the tuning range.

A further object is to provide such a new and improved tuner in which the tuning devices are tuned by means of members movable simultaneously along predetermined substantially parallel paths, and in which the cams extend generally parallel to such paths, for cooperation with cam followers or riders which are mounted on the movable tuning members.

Still another object is to provide new and improved tuners of the foregoing character which afford precise adjustment of the tracking and coupling, yet are serviceable, reasonably easy to manufacture, and low in cost.

Further objects and advantages of the invention will appear from the following description, taken with the accompanying drawings, in which:

FIG. 1 is a plan view, partly in longitudinal section, of a tuner to be described as an illustrative embodiment of the present invention.

FIGS. 2 and 3 are elevational sectional views, taken generally along lines 2—2 and 3—3 in FIG. 1.

Figures 1, 2, 3, 4:
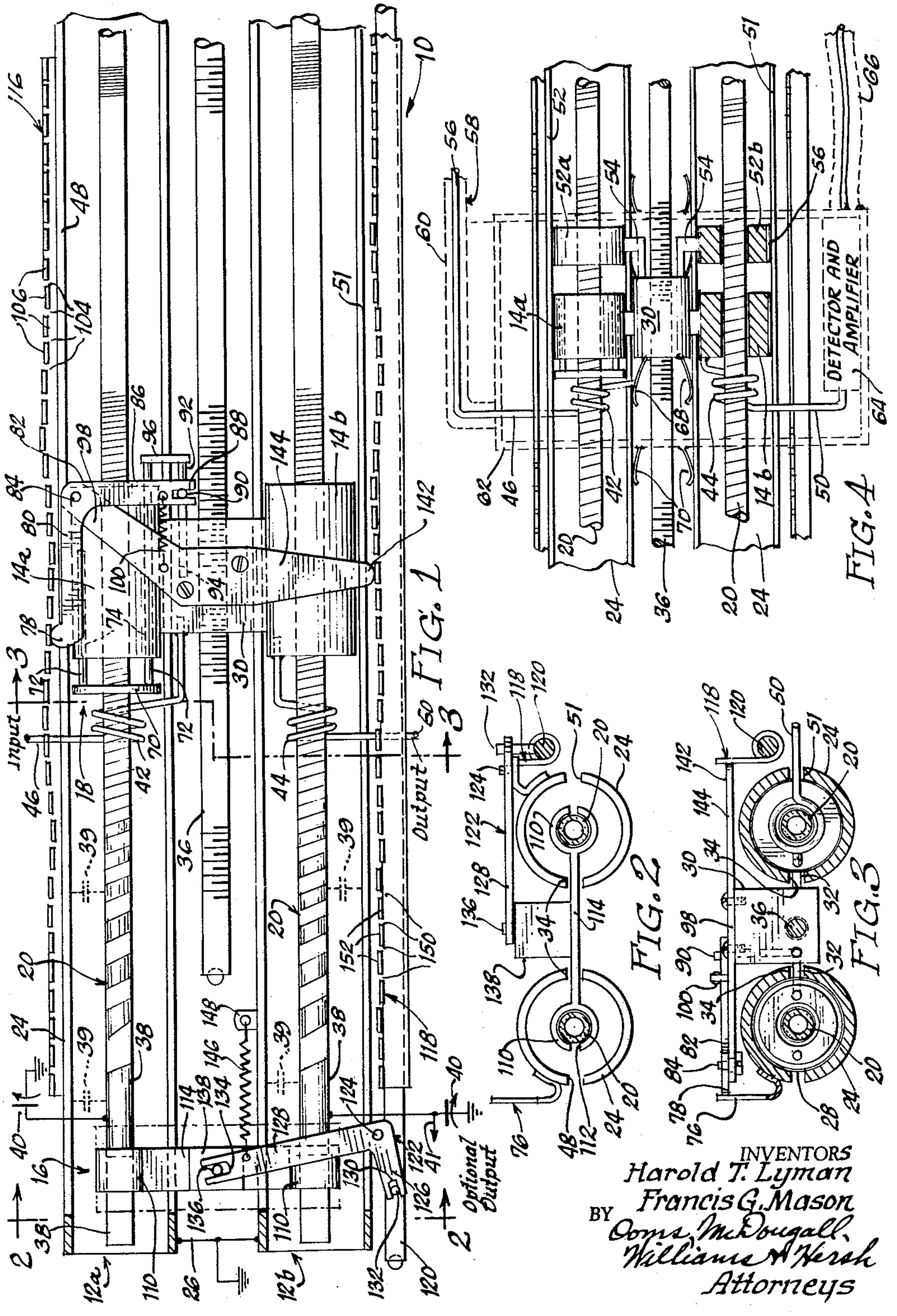
FIG. 4 is a fragmentary view similar to the central portion of FIG. 1, but showing certain modifications.

As already indicated, FIGS. 1–3 illustrate a radio frequency tuner 10 adapted to cover an extremely wide frequency range. The illustrated tuner comprises a pair of tuned circuits or tuning devices 12*a* and 12*b* which are adapted to be tuned to substantially the same operating frequency. The tuning devices 12*a* and 12*b* are provided with tuning members 14*a* and 14*b* which are movable along predetermined paths to vary the operating frequency. In this case, the members 14*a* and 14*b* are movable along straight line paths which are substantially parallel.

Coupling between the tuning devices 12*a* and 12*b* is provided by a variable coupling device 16. As will be described in detail shortly, the tuner 10 is provided with means for adjusting the coupling device 16 as the tuning members 14*a* and 14*b* are moved along their paths, so as to provide the desired amount of coupling throughout the tuning range of the tuner 10. A variable tracking device

18 is provided to effect slight variations in the tuning of one of the tuning devices 12*a* and 12*b*, so that the operating frequencies of the tuning devices will be tracked to the same tuning curve as the tuning members 14*a* and 14*b* are moved along their paths to cover the frequency range of the tuner.

Figure 6:
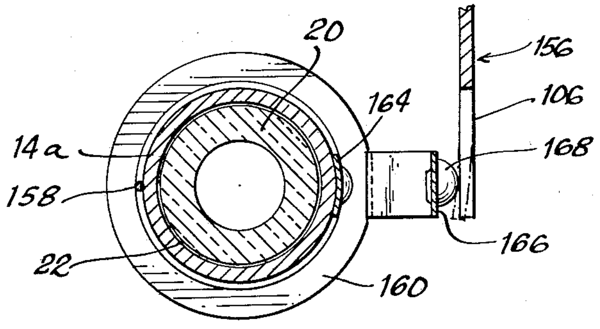
FIG. 6 is a cross sectional view, taken generally along the line 6—6 in FIG. 5.

The invention is applicable to a wide variety of tuners. However, by way of example, each of the illustrated tuning devices 12*a* is provided with an elongated generally helical inductance coil 20, which is circular in cross section, as shown in FIG. 3. The axis of each coil 20 is straight. In this case, the tuning members 14*a* and 14*b* take the form of conductive cylindrical electrodes or sleeves which are received over the coils 20 and are movable therealong. While each sleeve 14 may be in conductive engagement with the corresponding coil 20, it is preferred to provide a thin dielectric element therebetween, so that the sleeve will be capacitively coupled to the underlying portion of the coil. Preferably, the dielectric element takes the form of a coating 22 on the coil 20, as shown to best advantage in FIG. 6. In this regard, the tuner of FIG. 6 is the same as that of FIGS. 1–3.

In this case, each coil 20 extends along the axis of a corresponding conductive cylinder or tube 24, which shields the coil and provides coupling to the tuning sleeve 14. The tubes 24 are shown as being connected together by means of a grounded conductor 26, although various other connections may be made to the tubes. Each of the tuning sleeves 14*a* and 14*b* is closely received within the corresponding tube 24, for sliding movement therealong. While each sleeve 14 may be conductively engaged with the corresponding tube 24, it is preferred to provide insulation therebetween, so that the sleeve will be capacitively coupled to the tube. The insulation may advantageously take the form of a dielectric coating 28 applied to each sleeve, as shown to advantage in FIG. 3. The provision of the coatings 22 and 28 on the coil 20 and the sleeves 14a and 14b eliminates any electrical noises that might result if the sleeves were in sliding electrical contact with the coils 20 and the tubes 24.

The illustrated tuning sleeves 14*a* and 14*b* are connected together for simultaneous movement by an operating member or block 30. The sleeves 14*a* and 14*b* are securely connected to the block 30 by means of short bars 32 or the like which extend through longitudinal slots 34 formed in the tubes 24. The block 30 may be moved along a linear path by various means, such as the illustrated lead screw 36, which is threaded through the block. The lead screw 36 may be rotated by any suitable means (not shown).

As shown, the left-hand end of each coil 20 is formed with a cylindrical terminal portion 38 which may form one circuit terminal of the corresponding tuned circuit 12. The tube 24 may provide a second circuit terminal. It will be recalled that the tube 24 is capacitively coupled to the corresponding sleeve 14, and that the sleeve is capacitively coupled to the underlying portion of the coil 20. Thus, only the portion of the coil 20 to the left of the sleeve 14 is in the tuned circuit between the terminal portion 38 and the tube 24. Thus, the effective inductance of each of the tuning devices 12*a* and 12*b* is increased as the corresponding sleeve 14 is moved to the right. This inductance is resonated by the stray or distributed capacitances 39 between the coil 20 and the tube 24. These stray capacitances 39 are effectively in series with the capacitances between the sleeve and the tube 24, and between the coil 20 and the sleeve 14. Any external capacitance that may be introduced between the terminal portion 38 and the tube 24 also contributes to the resonating effect. It will be understood that the resonant frequency of each tuning device increases as the sleeve is moved to the left, and decreases with movement of the sleeve to the right.

In addition to changing the inductance of the coil 20, the movement of each sleeve 14 varies the effective stray capacitance 39 between the coil and the tube 24. The stray capacitance increases progressively as the sleeve is moved to the right. It will be recalled that such movement of the sleeve also increases the effective inductance of the coil 20. Thus, the increasing stray capacitance extends the range of the tuner. This is a matter of considerable advantage.

As shown, an external capacitor 40 may be connected between each terminal portion 38 and ground. Preferably, the capacitors 40 are variable. It will be recognized that the capacitors 40 are in parallel with the stray capacitances 39. In many cases, the capacitors 40 will not be needed to resonate the coils 20 in the desired frequency range. In that case, the capacitors may be omitted, and the terminals 38 may be left floating. In some cases, the terminal 38 of the second tuning device 12*b* may be connected to the grid of a tube, or to some other circuit element, by an output lead 41.

Various arrangements may be employed to supply input energy to the tuner 10, and to take output energy therefrom. In this case, the input is supplied by means of an input coil 42, while the output is taken by an output coil 44. Each coil is preferably made of a few turns of heavy wire so as to be self-supporting. The coil 42 is disposed around the coil 20, adjacent the left-hand end of the sleeve 14*a*. One end of the coil 42 is connected, both electrically and mechanically, to the block 30 and thence to the sleeve 14*a*. The other end of the coil takes the form of a terminal portion 46 which extends out of the tube 24 through a slot 48 therein. Similarly, one end of the coil 44 is connected to the sleeve 14*b*, while the other end of the coil takes the form of a terminal portion 50 which extends outwardly through a slot 51 in the corresponding tube 24. Thus, the input and output coils 42 and 44 are movable with the sleeves 14*a* and 14*b*. Suitable flexible connections may be made to the terminal portions 46 and 50, as will be described in greater detail shortly.

Certain modifications or elaborations of the tuner 10 are shown in FIG. 4. As shown, the sleeves 14*a* and 14*b* of FIG. 4 are supplemented by rings or auxiliary sleeves 52*a* and 52*b* which are secured to the operating block 30 by means of members 54. The rings 52*a* and 52*b* are disposed around the coils 20 to the right of the sleeves 14*a* and 14*b*. It will be apparent that the rings 52*a* and 52*b* are movable along the coils 20, with the sleeves 14*a* and 14*b*. While the rings 52*a* and 52*b* might be conductively engaged with the coils 20 and the tubes 24, it is preferred to insulate the rings so that they will be capacitively coupled to the coils and the tubes. The coating 22 on each coil 20 provides insulation between the coil and the corresponding ring 52. A dielectric coating 56 may be applied to each ring 52 to insulate the ring from the corresponding tube 24.

The rings 52*a* and 52*b* perform the function of suppressing spurious resonances in the portions of the coils 20 to the right of the sleeves 14*a* and 14*b*. Were it not for the rings 52*a* and 52*b*, these portions of the coils would be "floating" and would tend to be self-resonant at unwanted frequencies. The provision of the rings 52*a* and 52*b* has a pronounced damping effect on such self-resonances, so that they are no longer troublesome. The spacing between each ring 52 and the corresponding sleeves 14 results in a high degree of damping throughout the tuning range.

As shown in FIG. 4, the input lead 46 is connected to the central conductor 56 of a flexible coaxial input cable 58. The outer conductor 60 of the cable 58 is connected to a housing or shield 62 which extends around the tubes 24 and is secured to the operating block 30 so as to travel with the sleeves 14*a* and 14*b*.

The output lead 50 may be connected to a suitable detector and amplifier circuit 64 mounted within the shield 62. A flexible coaxial cable 66 is connected to the output of the amplifier 64.

In this case, the threaded operating block 30 is provided with contact springs 68 which wipe against the tubes 24 to ground the block. Similar grounding springs 70 are provided on the shield 62.

The tuned circuits 12*a* and 12*b* may be tracked rather closely to the same tuning curve, by the simple expedient of making all components of the tuned circuits as nearly identical as possible. However, it is virtually impossible to make the tuning circuits totally identical, with the result that there will tend to be an appreciable tracking error. As already indicated, the illustrated tuner 10 is provided with an adjustable tracking device 18 to compensate for any tracking error, so as to secure tracking which is sufficiently accurate for all practical purposes.

The adjustable tracking device 18 comprises an element 70 which is movably mounted on one of the tuning members 14*a* and 14*b*, in this case the member 14*a*. Movement of the element 70 is effective to vary the tuning of the circuit 12*a* to a small extent, which, however, is sufficient to compensate for any tracking error. The tracking device 18 is arranged so that the position of the tracking member 70 may be adjusted at a large number of points throughout the range of movement of the tuning members 14a and 14*b*. In this way, precise tracking may be achieved throughout the tuning range.

The illustrated tracking member 70 takes the form of a conductive ring which is positioned around the coil 20 to the left of the sleeve 14*a*. The ring 70 is movable axially with respect to the sleeve 14*a*. Such movement of the ring 70 changes the effective inductance of the coil 20 to a small extent. Thus, the inductance of the coil 20 is decreased by movement of the ring 70 to the left, and increased by movement of the ring to the right. The ring 70 is made thin, and is spaced from the coil 20 and the tube 24, so that the tuning of the coil 20 will be changed only to a small extent when the ring is moved.

As shown, the tracking ring 70 is secured to guide rods 72 which are slidable in bores 74 formed in the sleeve 14*a*. The bores 74 extend parallel to the axis of the sleeve 14*a*.

The movement of the tracking ring 70 is controlled by a cam 76 which takes the form of a plate extending generally parallel to the path of movement of the sleeve 14*a*. The cam plate 76 is engaged by the cam follower 78 which is formed on the end of an arm 80. It will be seen that the arm 80 forms one portion of an L-shaped lever 82 which is swingable about a pivot 84. The lever 82 has a second arm 86 which is arranged to move the ring 70. Thus, the arm 86 extends generally at right angles to the direction of the guide rods 72. A longitudinal slot 88 is formed in the end of the arm 88, for slidably receiving a pin 90. As shown to advantage in FIGS. 1 and 3, the pin 90 extends upwardly from a guide rod 92 which is slidable in a bore 94 formed in the block 30. One of the guide rods 72 is connected to the rod 92 by a member 96. Thus, any swinging movement of the arm 86 is translated into reciprocating movement of the member 70.

The pivot 84 is mounted on a member 98 which is secured to the block 30. A spring 100 is stretched between the member 98 and the arm 86, so as to bias the lever 82 clockwise, and thereby hold the follower 78 against the cam 76.

The cam plate 76 may be bent locally so as to adjust the position of the tracking ring 70 at various points in the movement of the tuning sleeve 14*a*. To provide for easy, accurate adjustment, the cam plate 76 is formed with a large number of slots 104, spaced along the length of the cam and preferably extending transversely to the direction of movement of the tuning sleeve 14*a*. The slots 104 divide the cam 76 into a large number of individually bendable fingers or tabs 106. At any point in the movement of the sleeves 14a, the follower 78 will be engaging one of the tabs 106. Precise tracking may be obtained by bending this particular tab 106 so as to move the follower 78, and thereby shift the tracking ring 70. The tab is bent to such a position that the tuned circuit 12a will be adjusted to the same frequency as the tuned circuit 12b.

As already indicated, the variable coupling device 16 is provided so that the coupling between the tuned circuits 12a and 12b may be adjusted at various points throughout the tuning range of the tuner 10. Any suitable type of coupling may be provided between the tuned circuits 12a and 12b. Thus, for example, either inductive coupling or capacitive coupling may be utilized. As shown, the variable coupling device 16 provides capacitive coupling, which is variable so that the desired coupling may be obtained throughout the tuning range. Of course, the amount of coupling affects the width of the band passed by the tuner. The coupling may be adjusted to maintain the band width substantially constant, or to provide desired changes in the band width from one portion of the band to another.

In the illustrated arrangement of the coupling device 16, the capacitive coupling is provided by a pair of electrodes 110 which are slidably movable along the respective coils 20. As shown, each electrode 110 takes the form of a discontinuous ring, having a longitudinal slot 112 formed therein. The formation of the slots 112 prevents the rings 110 from acting as short circuited turns. The electrodes 110 are connected together, both electrically and mechanically, by a bar 114, which extends through the slots 34 in the tubes 24. Thus, the interconnected electrodes 110 establish capacitive coupling between the coils 20. As shown, each electrode 110 is received part way over the left-hand end of the corresponding coil. The degree of coupling may be increased and decreased by moving the electrodes 110 to the right and to the left, respectively, as indicated by the broken line positions of the electrodes in FIG. 1. The extent to which the left-hand ends of the coils 20 are received within the electrodes 110 increases as the electrodes are moved to the right, and decreases with movement of the electrodes to the left.

The variable coupling mechanism 16 is arranged so that the position of the electrodes may be changed as the tuning sleeves 14a and 14b are moved along the coils 20. In the illustrated construction, this operation is achieved by providing an adjustable cam 118 which is adapted to move the electrodes 110. As shown, the cam 118 takes the form of a plate extending along the paths of the tuning sleeves 14a and 14b. The cam plate 118 is secured to a shaft 120 which is rotatable about an axis parallel to the paths of the sleeves 14a and 14b. By means of an L-shaped lever 122, the shaft 120 is connected to the bar 114, and thence to the electrodes 110. It will be seen that the lever 122 is swingable about a vertical pivot 124. The lever 122 has a relatively short arm 126 which is connected to the shaft 120, and a relatively long arm 128, connected to the bar 114. A slot 130 is formed in the end of the arm 126 to receive a pin 132 extending radially from the shaft 120. By means of this pin-and-slot connection, any rotation of the shaft 120 causes swinging movement of the lever 122.

Similarly, a slot 134 is formed in the end of the arm 128, to receive a pin 136 extending upwardly from an insulating block 138 mounted on the bar 114. This pin-and-slot connection translates any swinging movement of the lever 122 into reciprocating movement of the bar 114.

The position of the cam 118 is controlled by a rider 142 which engages the cam and is movable with the tuning sleeves 14a and 14b. In this case, the rider 142 constitutes the rounded outer end of a member or bar 144 which is secured to the block 30. It will be seen that the member 144 is integral with the member 98.

The cam 118 is biased against the rider 142 by means of a spring 146. In this case, the spring 146 is stretched between the arm 128 and a fixed anchor 148, so as to bias the lever 122 in a clockwise direction.

The shape of the cam 118 will determine the manner in which the coupling is varied as the tuning sleeves 14a and 14b are moved along the coils 20. The cam plate 118 may be curved, to provide a progressive change in coupling, or generally flat, as shown, to afford relatively constant coupling.

The illustrated cam 118 is formed with a large number of spaced transverse slots 150 which divide the cam into a large number of individually bendable tabs or fingers 152. As the tuning sleeves 14a and 14b are moved along the coils, the rider 142 will engage each of the tabs 152 in turn. At any particular position of the tuning sleeves 14a and 14b, the coupling may be adjusted by bending the tab 152 which is engaging the rider 142. This will change the position of the cam 118, and hence will move the coupling electrodes 110. By proper adjustment of the tabs 152, the coupling may be controlled so as to maintain substantially constant band width throughout the tuning range of the tuner 10.

Figure 5:
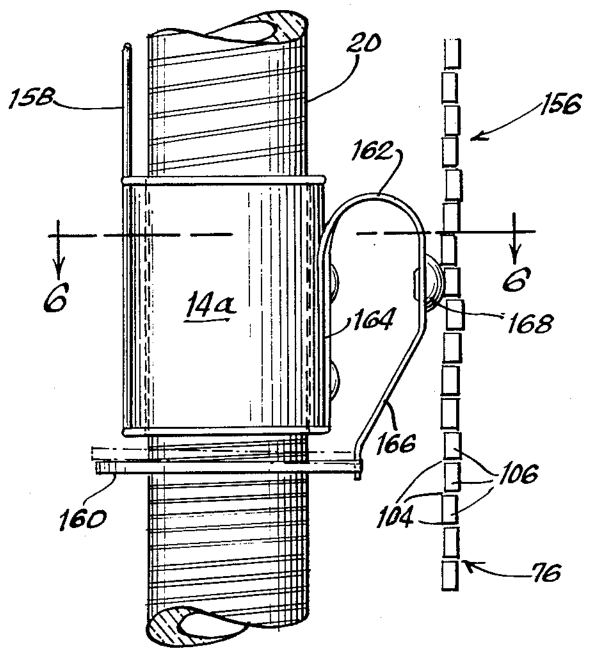
FIG. 5 is a fragmentary enlarged plan view showing another modified construction.

FIGS. 5 and 6 illustrate a somewhat modified variable tracking device 156. The tuning sleeve 14a and the coil 20 of FIGS. 5 and 6 may be substantially the same as in FIGS. 1–4. However, the shielding tube 24a is dispensed with in FIGS. 5 and 6. Instead, a connection is made to the movable sleeve 14a by means of a flexible conductive rod 158 secured to the sleeve. It will be understood that the rod 158 may be connected to a suitable circuit and a suitable operating mechanism.

The arrangement of FIGS. 5 and 6 may also utilize the stationary adjustable cam plate 76 of FIGS. 1–3. As before, the plate 76 is formed with a large number of individually bendable tabs or fingers 106, with slots 104 therebetween.

Much as in FIGS. 1–4, the tracking device 156 employs a movable tracking member in the form of a ring 160 which is disposed around the coil 20 at one end of the tuning sleeve 14a. The ring 160 is mounted on the sleeve 14a for generally axial movement relative thereto, so as to cause small changes in the tuning of the coil 20. In the illustrated construction, a generally U-shaped spring 162 is connected between the sleeve 14a and the ring 160. Thus, the spring 162 has a first leg 164 which is secured to the sleeve 14a, and a second leg 166, secured to the ring 160. A cam follower 168 is mounted on the leg 166 for engagement with the cam 76. As shown, the follower 168 simply takes the form of a rounded button secured to the spring leg 166.

The spring 162 biases the follower 168 against the cam plate 76, so that the follower will move laterally in conformity with any lateral deviations of the tabs 106. Any movement of the follower 168 will cause the ring 160 to swing toward or away from the tuning sleeve 14a. This will change the tuning of the coil 20 to a sufficient extent to track the coil with one or more similar coils. By bending the individual tabs 106, the tuning of the coil 20 may be tracked to the desired tuning curve, throughout the tuning range.

Thus, the illustrated tuners provided for adjustment of both the tracking and the coupling between two or more tuned circuits. Simply by bending the tabs on the adjustable cams, the tracking and coupling may be adjusted throughout the tuning range.

Various other modifications, alternative constructions and equivalents may be employed without departing from the true spirit and scope of the invention, as exemplified in the foregoing description, and defined in the following claims:

We claim:

1. In a radio frequency tuner, the combination comprising first and second coils, first and second tuning sleeves movable along said respective coils, an operating member secured to said first and second sleeves, a lead screw in threaded engagement with said operating member for moving said sleeves along said coils, a tracking ring received around said first coil adjacent one end of said first sleeve, means mounting said ring on said first sleeve for axial movement relative thereto, a stationary comb-like cam plate extending generally parallel to the path of movement of said first sleeve, a cam follower engaging said cam plate, means connecting said follower to said tracking ring for moving said ring in response to movement of said follower, said cam plate having a large number of closely spaced fingers thereon extending transversely to the direction of movement of said first sleeve, each of said fingers being individually bendable for adjusting the position of said tracking ring when said cam follower is engaging said finger, a coupling member extending between said first and second coils and movable along said coils to vary the amount of coupling therebetween, a rotatable shaft extending substantially parallel to the paths of said sleeves, means connecting said shaft to said coupling member for moving said coupling member in response to rotation of said shaft, a second cam plate secured to said shaft and extending generally parallel to the paths of said sleeves, a cam rider secured to said operating member and engaging said second cam plate, biasing means for maintaining said second cam plate in engagement with said cam rider, said second cam plate having a large number of closely spaced fingers thereon extending transversely to the length of said second cam plate and disposed for successive engagement by said cam rider, each of said fingers on said second cam plate being individually bendable to adjust the coupling between said coils when said cam rider is engaging each of such fingers.

2. In a radio frequency tuner, the combination comprising first and second tuning devices, each of said devices having a tuning member movable along a predetermined path to vary the operating frequency of said tuning device, an operating member connected to said tuning members for simultaneously moving said tuning members along said paths, said first tuning device having a tracking member mounted on said tuning member thereof for movement relative to such tuning member for effecting slight variations in the operating frequency of said first tuning device, a first cam plate extending generally parallel to the path of said tuning member of said first tuning device, a movable cam follower engaging said cam plate and mounted on said tuning member of said first tuning device, means connecting said cam follower to said tracking member for moving said tracking member in response to movement of said follower, said cam plate having a plurality of individually bendable tabs spaced therealong for adjusting the position of said cam follower when engaging each of said tabs, a movable coupling element for adjusting the amount of coupling between said first and second tuning devices, a second cam plate extending generally parallel to the path of movement of said operating member and movable transversely to such path, a cam rider engaging said second cam plate and secured to said operating member, means connecting said second cam plate to said coupling member for moving said coupling member in response to transverse movement of said second cam plate, said second cam plate having a plurality of individually bendable tabs thereon spaced therealong for successive engagement by said cam rider to adjust the coupling between said tuning devices when said rider is engaging each of said tabs.

3. In a radio frequency tuner, the combination comprising a pair of tuning devices having respective tuning members movable along substantially parallel paths for varying the operating frequencies of said turning devices, an operating member connected to said tuning members for effecting simultaneous movement thereof, a movable coupling member for varying the amount of coupling between said tuning devices, a cam extending along the path of said operating member and movable transversely to such path, a cam rider secured to said operating member and engaging said cam, and means for connecting said cam to said coupling member for moving said coupling member in response to transverse movement of said cam, said cam being generally comb-like in shape and having a plurality of tabs spaced therealong and successively engageable by said cam rider for adjusting the position of said coupling member when said rider is engaging each of said tabs.

4. In a radio frequency tuner, the combination comprising first and second tuning devices, each of said devices having a movable tuning member for varying the operating frequency of said tuning device, means for simultaneously moving said tuning members, said first tuning device having a tracking member movable relative to such tuning member for effecting slight variations in the operating frequency of said first tuning device, a first cam extending along the path of said tuning member of said first tuning device, a movable cam follower engaging said cam, means connecting said cam follower to said tracking member for moving said tracking member in response to movement of said follower, said cam having a plurality of individually adjustable elements spaced therealong for adjusting the position of said cam follower when engaging each of said elements, a movable coupling element for adjusting the amount of coupling between said first and second tuning devices, a movable second cam extending adjacent said tuning members, a cam rider engaging said second cam and movable with said tuning members, means connecting said second cam to said coupling member for moving said coupling member in response to movement of said second cam, said second cam having a plurality of individually adjustable elements thereon spaced therealong for successive engagement by said cam rider to adjust the coupling between said tuning devices when said rider is engaging each of such adjustable elements.

5. In a radio frequency tuner, the combination comprising first and second coils, first and second tuning members movable along said respective coils, means for moving said members simultaneously along said coils, a tracking member adjacent one end of said first tuning member, means mounting said tracking member on said first member for movement relative thereto, a stationary cam plate extending generally parallel to the path of movement of said first tuning member, a cam follower engaging said cam plate, means connecting said follower to said tracking member for moving said ring in response to movement of said follower, said cam plate having a plurality of individually bendable portions for adjusting the position of said tracking ring when said cam follower is engaging each portion, a coupling member extending between said first and second coils and movable along said coils to vary the amount of coupling therebetween, a rotatable shaft extending substantially parallel to the paths of said tuning member, means connecting said shaft to said coupling member for moving said coupling member in response to rotation of said shaft, a second cam plate secured to said shaft and extending generally parallel to the paths of said tuning members, a cam rider movable with said tuning members and engaging said second cam plate, biasing means for maintaining said second cam plate in engagement with said cam rider, said second cam plate having a plurality of individually bendable elements disposed for successive engagement by said cam rider to adjust the coupling between said coils when said cam rider is engaging each of such elements.

6. In a radio frequency tuner, the combination comprising a tuning coil, a conductive tuning sleeve received around said coil and movable therealong for varying the resonant frequency of said tuner, means providing dielectric material between said sleeve and said coil, a tracking ring movably mounted on said sleeve and received around said coil adjacent said sleeve, said tracking ring being movable relative to said sleeve for effecting slight variations in the resonant frequency of said tuner, a stationary cam, extending along said coil, a cam follower engaging said cam and mounted on said tuning sleeve for movement therewith along said coil, said follower being movable relative to said tuning sleeve by said cam, means connecting said cam follower to said tracking ring for moving said tracking ring in response to movement of said follower by said cam, said cam being generally comb-like in shape and having a plurality of individually bendable tabs spaced therealong for successive engagement by said cam follower to adjust the position of said tracking ring when said cam follower is engaging each of said tabs.

References Cited in the file of this patent

UNITED STATES PATENTS

| | | |
|---|---|---|
| 1,577,613 | Dunmore | Mar. 23, 1926 |
| 2,290,705 | Pfost | July 21, 1942 |
| 2,468,071 | Hunter | Apr. 26, 1949 |
| 2,505,572 | Overacker | Apr. 25, 1950 |
| 2,808,506 | Skwarek | Oct. 1, 1957 |
| 2,883,864 | Mason | Apr. 28, 1959 |